United States Patent
Chung et al.

(10) Patent No.: US 9,276,537 B2
(45) Date of Patent: Mar. 1, 2016

(54) AMPLIFIER INDUCTOR SHARING FOR INDUCTIVE PEAKING AND METHOD THEREFOR

(71) Applicant: TAIWAN SEMICONDUCTOR MANUFACTURING COMPANY, LTD., Hsinchu (TW)

(72) Inventors: Tao Wen Chung, San Jose, CA (US); Chan-Hong Chern, Palo Alto, CA (US); Ming-Chieh Huang, San Jose, CA (US); Chih-Chang Lin, San Jose, CA (US); Yuwen Swei, Fremont, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 23 days.

(21) Appl. No.: 14/088,521

(22) Filed: Nov. 25, 2013

(65) Prior Publication Data

US 2014/0085009 A1    Mar. 27, 2014

Related U.S. Application Data

(63) Continuation of application No. 13/312,228, filed on Dec. 6, 2011, now Pat. No. 8,614,604.

(51) Int. Cl.
*H03F 3/191* (2006.01)
*H03F 3/68* (2006.01)
*H03F 1/42* (2006.01)
*H03F 3/195* (2006.01)
*H03F 3/45* (2006.01)

(52) U.S. Cl.
CPC .. *H03F 3/68* (2013.01); *H03F 1/42* (2013.01); *H03F 3/195* (2013.01); *H03F 3/45183* (2013.01); *H03F 3/191* (2013.01); *H03F 2200/36* (2013.01); *H03F 2200/405* (2013.01); *H03F 2203/45638* (2013.01); *H03F 2203/45702* (2013.01)

(58) Field of Classification Search
CPC ............. H03F 1/0216; H03F 2200/03; H03F 2200/171; H03F 2200/324; H03F 2200/336; H03F 2200/405; H03F 2200/447; H03F 2200/96; H03F 2203/21142; H03F 3/183; H03F 3/193; H03F 3/211; H03F 3/2171
USPC ............ 330/98, 133, 150, 252–254, 305, 310
See application file for complete search history.

(56) References Cited

U.S. PATENT DOCUMENTS

| | | | |
|---|---|---|---|
| 6,952,132 B2 * | 10/2005 | Bhattacharjee et al. | 330/140 |
| 7,215,194 B2 * | 5/2007 | Kucharski et al. | 330/252 |
| 7,586,372 B1 | 9/2009 | Voo | |
| 7,598,788 B2 | 10/2009 | Cao | |
| 7,755,426 B2 | 7/2010 | Kocaman et al. | |
| 8,625,240 B2 * | 1/2014 | Chung et al. | 361/56 |

FOREIGN PATENT DOCUMENTS

WO   2005119906   12/2005

* cited by examiner

*Primary Examiner* — Khanh V Nguyen
(74) *Attorney, Agent, or Firm* — Hauptman Ham, LLP

(57) ABSTRACT

A method of sharing inductors for inductive peaking of an amplifier includes calculating a single stage inductance of a single stage for inductive peaking in order to have a stable impulse response. The method further includes determining a number of stages for shared inductance for inductive peaking. The method further includes sharing at least two inductors having the shared inductance among the determined number of stages for inductive peaking.

20 Claims, 6 Drawing Sheets

AMPLIFIER INDUCTOR SHARING FOR INDUCTIVE PEAKING AND METHOD THEREFOR

PRIORITY CLAIM

The present application is a continuation of U.S. application Ser. No. 13/312,228, filed Dec. 6, 2011, which is incorporated by reference herein in its entirety.

TECHNICAL FIELD

The present disclosure relates generally to an amplifier, and more particularly to inductive peaking of the amplifier.

BACKGROUND

Inductive peaking is used in many amplifier applications, e.g., broadband amplifiers, to increase the bandwidth. The increased bandwidth is achieved by inserting inductors and utilizing the increase in inductor impedance with frequency to compensate for the effects of decreasing gain with frequency. However, inductors occupy a relatively large area of an integrated circuit chip.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
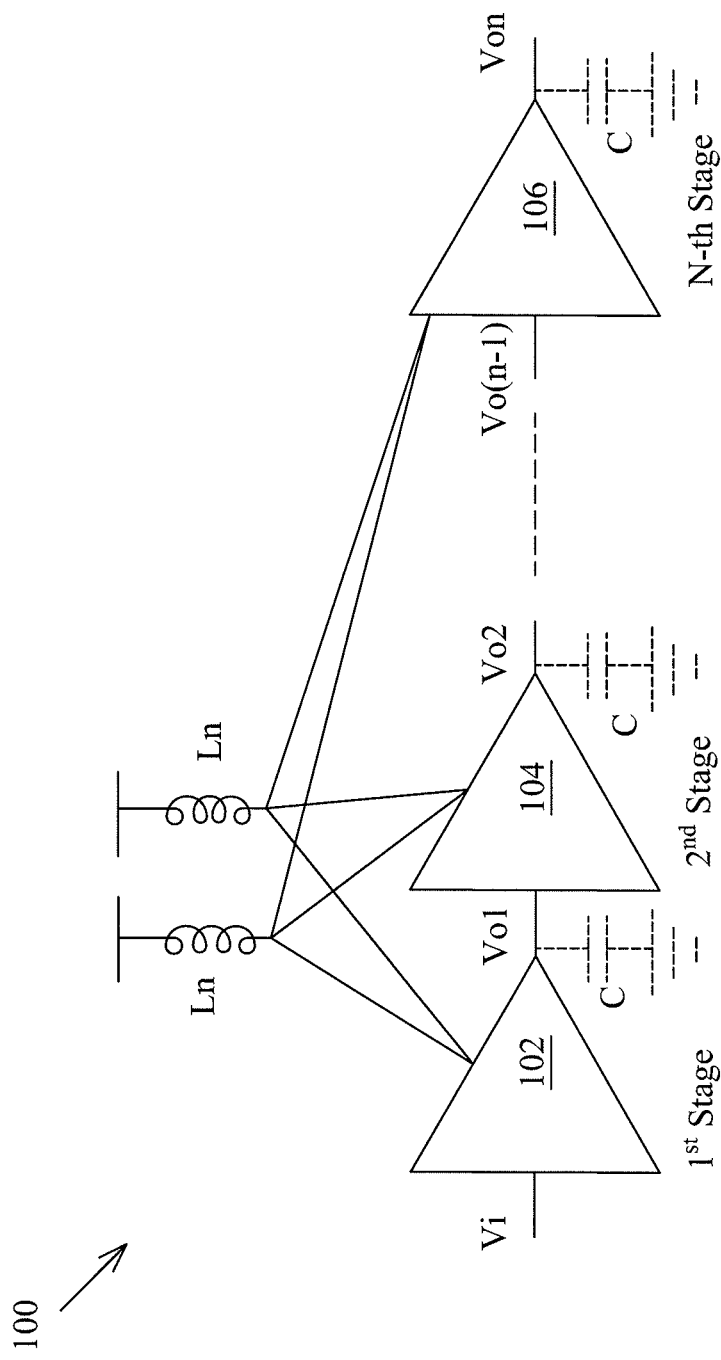
FIG. 1 is a schematic diagram of an exemplary amplifier sharing inductors among multiple stages for inductive peaking according to some embodiments.

FIG. 1 is a schematic diagram of an exemplary amplifier sharing inductors among multiple stages for inductive peaking according to some embodiments. An amplifier 100 has N stages, e.g., a first stage 102, a second stage 104, . . . , an N-th stage 106. N is an integer number greater than 1. An amplifier input signal Vi is amplified going through each stage providing a respective output, e.g., Vo1 after the first stage 102, Vo2 after the second stage 104, . . . , Vo(n−1) after the (N−1) stage (not shown), and Von after the Nth stage.

Each stage has an output loading capacitance C shown as dotted lines. The output loading capacitance C is not a separate physical element added to the amplifier 100, but rather a capacitance observed at each output node of each stage, originating mostly from the next (following) stage (or circuit). In other embodiments, a separate physical capacitor is added to the amplifier 100 at the output node of a stage. The N stages of the amplifier 100 share inductors Ln in the same current phase for inductive peaking. The amplifier 100 includes 2 inductors Ln in this example. In other embodiments, the number of inductors Ln is greater than 2.

Figure 2:
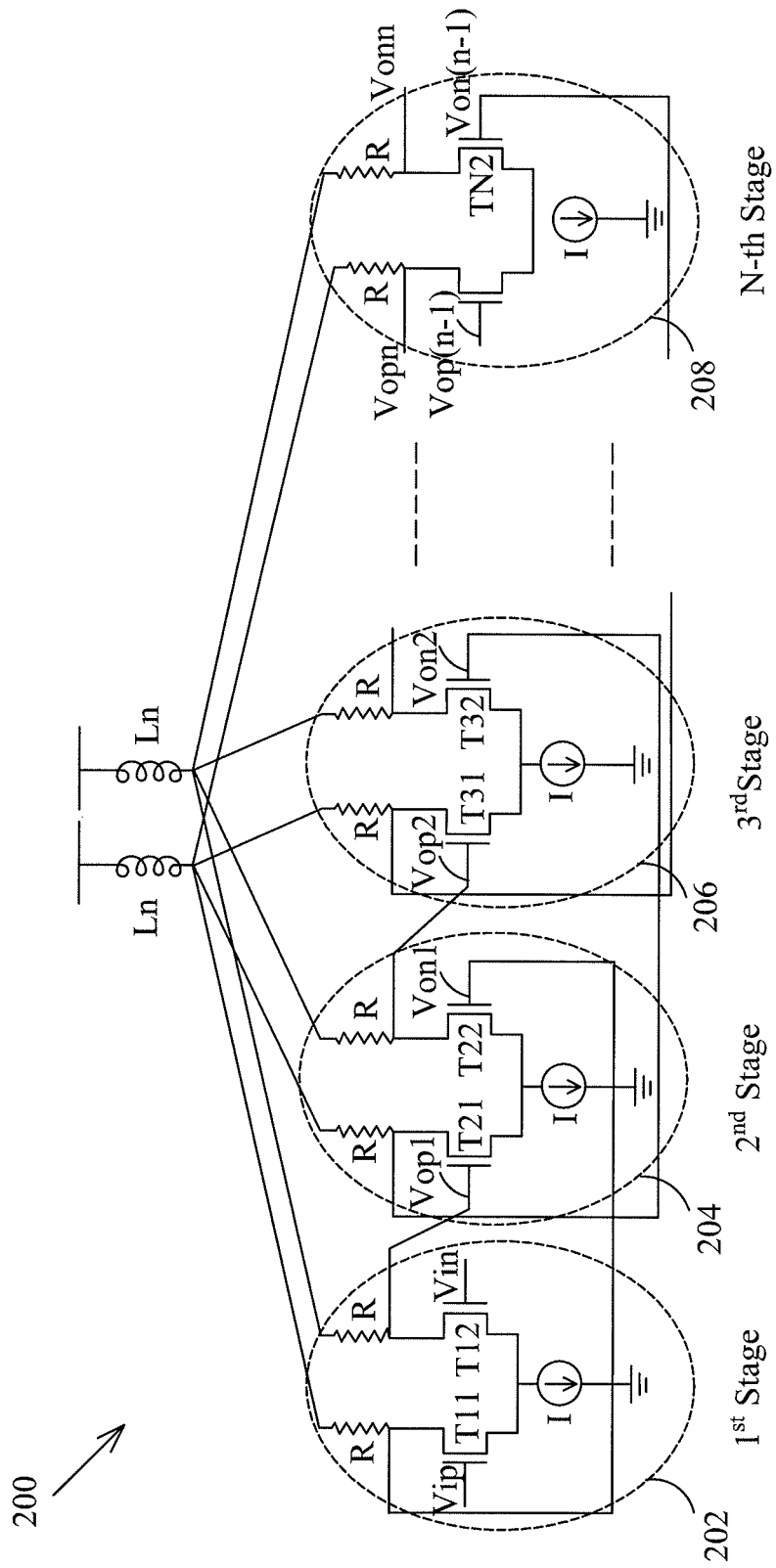
FIG. 2 is an exemplary schematic circuit diagram of the amplifier in FIG. 1 according to some embodiments.

FIG. 2 is an exemplary schematic circuit diagram of the amplifier in FIG. 1 according to some embodiments. An amplifier 200 includes a first stage amplifier 202, a second stage 204, a third stage 206, . . . , an N-th stage 208. N is an integer number greater than 1. The first stage 202 has differential inputs Vip and Vin. The first stage 202 outputs Vop1 and Von1 are inputs to the second stage 204. The second stage 204 outputs Vop2 and Von2 are inputs to the third stage 206, etc. And the (N−1) stage (not shown) outputs Vop(n−1) and Von(n−1) are inputs to the N-th stage 208. The N-th stage 208 has outputs Vopn and Vonn.

Each stage has two transistors (e.g., T11 and T12 for the first stage 202, T21 and T22 for the second stage 204, . . . , etc.) receiving input signals (e.g., Vin and Vip for the first stage 202, Vop1 and Von1 for the second stage 204, . . . , etc.). The two transistors of each stage are coupled to two resistors R, input nodes (e.g., nodes for Vip and Vin), and a current source I. The resistors R of each stage are coupled to respective output nodes (e.g., nodes for Vop1 and Von1 ). The N stages of the amplifier 200 share two inductors Ln, where each inductor Ln is coupled to a respective resistor R (one of the two resistors) in each stage for inductive peaking of the amplifier 200 as shown in FIG. 2.

The transfer function of each stage (e.g., 202, 204, 206, 208) is given by the following equation:

$$\frac{V_{output}}{V_{input}} = g_m \left( \frac{R + sL}{LCs^2 + RCs + 1} \right) = -g_m R \frac{s + 2\zeta\omega}{s^2 + 2\zeta\omega s + \omega^2} \frac{\omega}{2\zeta}, \quad \text{Equation (1)}$$

where L is the inductance of Ln (for a single stage), C is the capacitance of an output node (of the single stage), R is the resistance (for a single stage), a damping factor $$\zeta = R/2 \sqrt{\frac{C}{L}},$$

and gm is a transconductance of one transistor (of the single stage), e.g., T11 or T12.

For example, Vinput is the difference between the two inputs Vip and Vin, and Voutput is the difference between the two outputs Vop1 and Von1 in the first stage 202. For the amplifier 200, the damping factor and elements values such as resistance and capacitance are selected in order to have a stable output signal. In one example, the damping factor is selected as $$\xi = \frac{\sqrt{2}}{2},$$

which makes the inductance $L=R^2C/2$. More details regarding the damping factor are provided as described below. The amplifier 200 can be used in various applications, e.g., broadband operational amplifier, limiting amplifier, trans-impedance amplifier, etc.

Figure 3B:
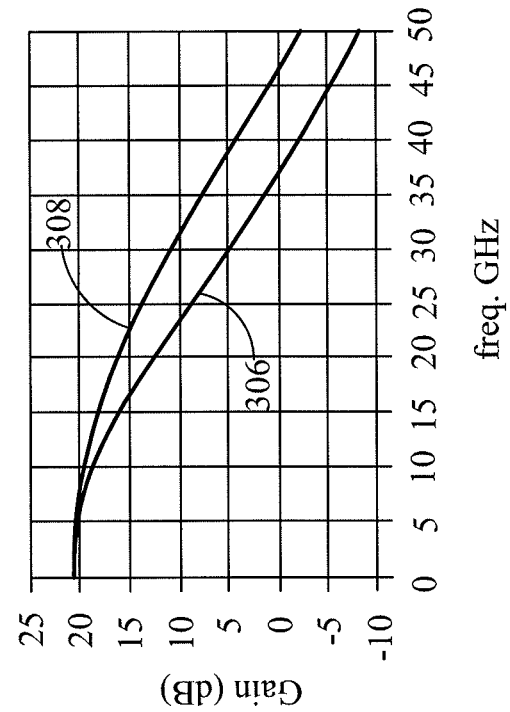
FIGS. 3A-3B are plots of gain vs. frequency of an exemplary 3-stage amplifier similar to FIG. 2 and another exemplary 3-stage amplifier not sharing inductors for different inductance values according to some embodiments.
Figure 3A:
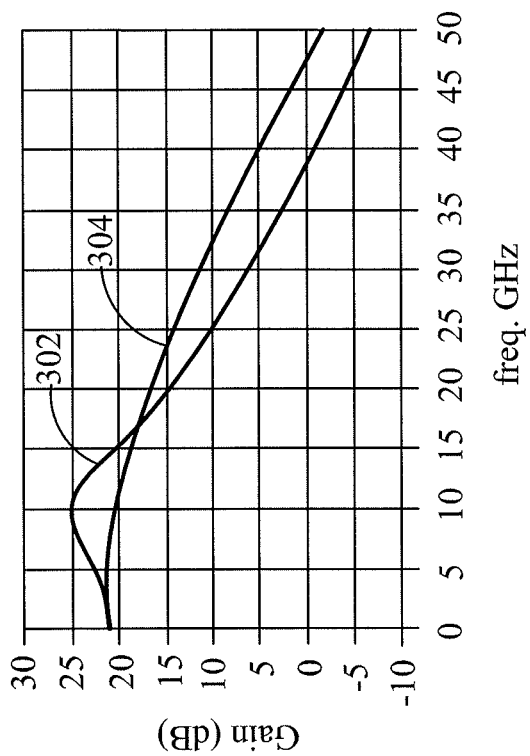

FIGS. 3A-3B are plots of gain vs. frequency of an exemplary 3-stage amplifier similar to FIG. 2 and another exemplary 3-stage amplifier not sharing inductors for different inductance values according to some embodiments. In FIG. 3A, a waveform 302 represents gain vs. frequency for the exemplary 3-stage amplifier similar to FIG. 2 having an inductance of Ln greater than L/3, where L is the value calculated for a single stage based on the relationship $$\xi = R/2\sqrt{\frac{C}{L}},$$

with the damping factor $$\xi = \frac{\sqrt{2}}{2}.$$

Another waveform 304 represents gain vs. frequency for another exemplary 3-stage amplifier not sharing inductors (each stage has separate inductors). The waveform 302 indicates that having an inductance of Ln greater than L/3 shared among multiple stages result in unstable gain vs. frequency plot due to the damping factor less than $$\frac{\sqrt{2}}{2}.$$

In FIG. 3B, a waveform 306 represents gain vs. frequency for the exemplary 3-stage amplifier having an inductance of Ln less than L/3, where L is the value calculated as described above, corresponding to the damping factor of $$\frac{\sqrt{2}}{2}.$$

Another waveform 308 represents gain vs. frequency for another exemplary 3-stage amplifier not sharing inductors (each stage has separate inductors). The waveform 306 indicates that having an inductance of Ln less than L/3 shared among multiple stages result in reduced bandwidth due to the damping factor greater than $$\frac{\sqrt{2}}{2}.$$

The amplifier 200 sharing inductance of Ln=L/N has a similar bandwidth as an amplifier not sharing inductors (each stage has separate inductors). For example, for an exemplary 2-stage amplifier sharing two L/2 inductors, the BW is about 21 GHz, while an exemplary amplifier not sharing inductors (using 4 inductors) has BW about 19.5 GHz. Also, for an exemplary 3-stage amplifier sharing two L/3 inductors, the BW is about 16.9 GHz, while an exemplary amplifier not sharing inductors (using 6 inductors) has BW about 16.7 GHz.

Figure 4:
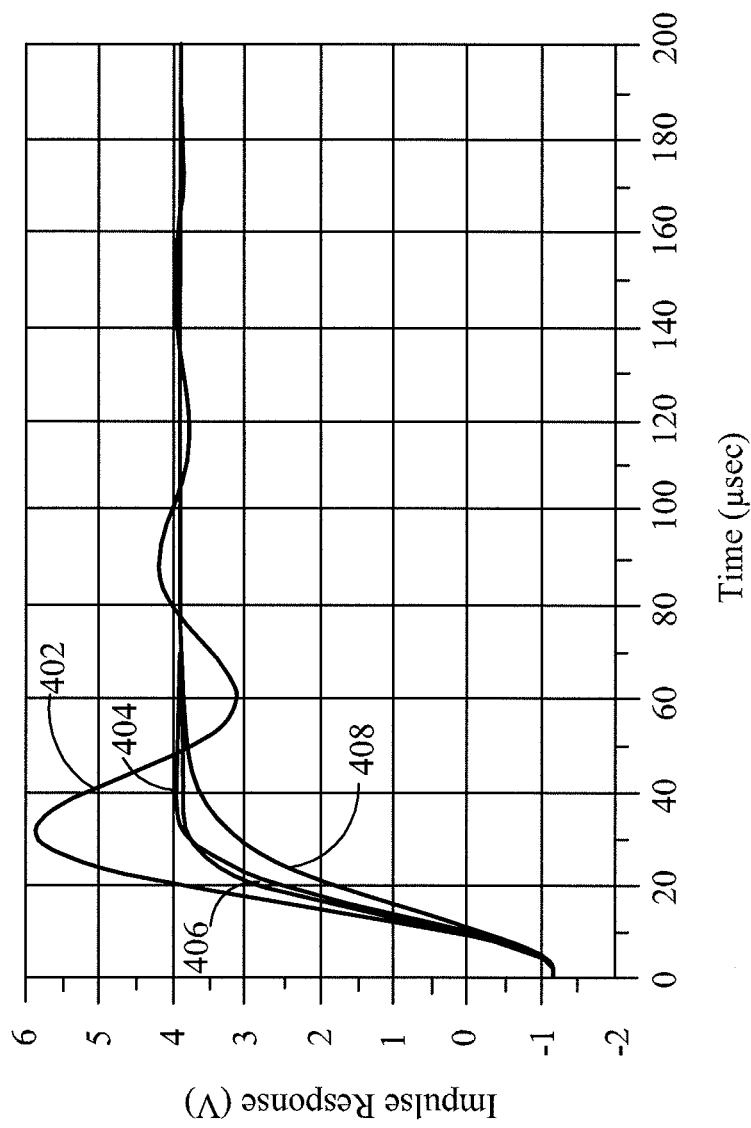
FIG. 4 is a plot of impulse response vs. time of an exemplary 3-stage amplifier similar to FIG. 2 and another exemplary 3-stage amplifier not sharing inductors for different inductance values according to some embodiments.

FIG. 4 is a plot of impulse response vs. time of an exemplary 3-stage amplifier similar to FIG. 2 and another exemplary 3-stage amplifier not sharing inductors for different inductance values according to some embodiments. A waveform 402 represents an impulse response vs. time for the exemplary 3-stage amplifier similar to FIG. 2 having an inductance Ln greater than L/3, where L is the value corresponding to the damping factor of $$\frac{\sqrt{2}}{2}.$$

The waveform 402 shows that it takes a relatively longer time for the impulse response to stabilize.

A waveform 404 represents an impulse response vs. time for the exemplary 3-stage amplifier in FIG. 2 having an inductance Ln equal to L/3, where L is the value calculated as described above, corresponding to the damping factor of $$\frac{\sqrt{2}}{2}.$$

A waveform 406 represents an impulse response vs. time for another exemplary 3-stage amplifier not sharing inductors (each stage has separate inductors). The waveforms 404 and 406 show similar impulse responses.

A waveform 408 represents an impulse response vs. time for the exemplary 3-stage amplifier in FIG. 2 having an inductance Ln less than L/3, where L is the value corresponding to the damping factor of $$\frac{\sqrt{2}}{2}.$$

The waveform 408 indicates that the impulse response is relatively slower (due to reduced bandwidth).

The simulation results shown above in FIGS. 3A, 3B, and 4 also apply to the amplifier 200 with different number of stages. For example, for N stages, if Ln is greater than L/N, the amplifier gain vs. frequency will be unstable, while if Ln is less than L/N, the amplifier will have reduced bandwidth BW. (N is an integer number greater than 1.) Thus, the amplifier 200 in FIG. 2 has inductors Ln having inductance=L/N to provide stable gain vs. frequency and impulse response having improved bandwidth in some embodiments. For example, Ln=L/2 for a 2-stage amplifier, Ln=L/5 for a 5-stage amplifier, etc.

Figure 5:
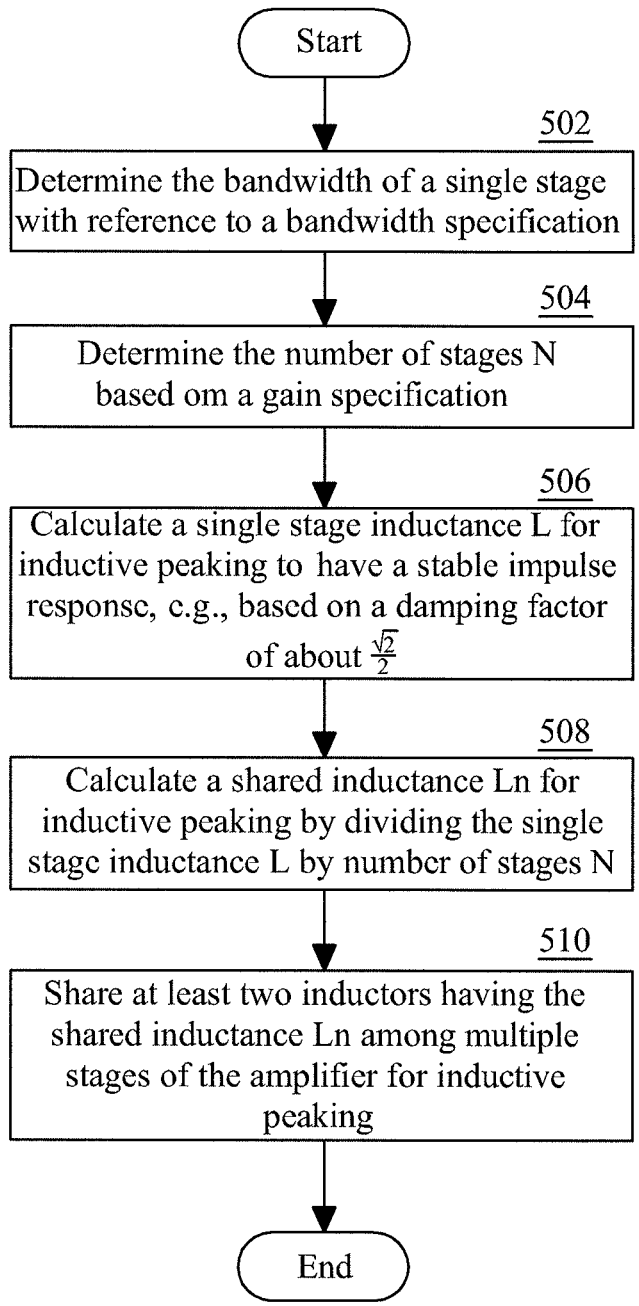
FIG. 5 is a flowchart of an exemplary method of sharing inductors for inductive peaking for an amplifier in FIG. 2 according to some embodiments.

FIG. 5 is a flowchart of an exemplary method of sharing inductors for inductive peaking for an amplifier in FIG. 2 according to some embodiments. At step 502, the bandwidth of a single stage is determined with reference to a bandwidth (BW) specification of the amplifier. The bandwidth is determined based on element values such as resistor R coupled to the output node of the single stage and output loading capacitance C of the single stage. For example, if the calculated BW=1/(2πRC), then BW=3.18 GHz when R is 100Ω and C is 500 fF. If the BW specification of the amplifier is 3 GHz, the calculated BW satisfies the BW specification.

At step 504, the number of stages N (N>1) is determined based on a gain specification. For example, if the gain specification is 30 dB and each stage gain is 10 dB, N=3 stages. At step 506, a single stage inductance L is calculated for inductive peaking to have a stable impulse response, e.g., based on a damping factor of about $$\frac{\sqrt{2}}{2}.$$

For example, $L=R^2C/2=2.5$ nH to have a damping factor of $$\frac{\sqrt{2}}{2},$$

given the above example values of elements R and C.

At step 508, a shared inductance, e.g., Ln in FIGS. 1 and 2, for inductive peaking is calculated by dividing the single stage inductance L by the number of stages N. For example, Ln=L/3=0.833 nH, given the above example value of L and a 3-stage amplifier. At step 510, at least two inductors having the shared inductance Ln are shared among multiple stages for inductive peaking, e.g., as shown in FIG. 2.

Figure 6:
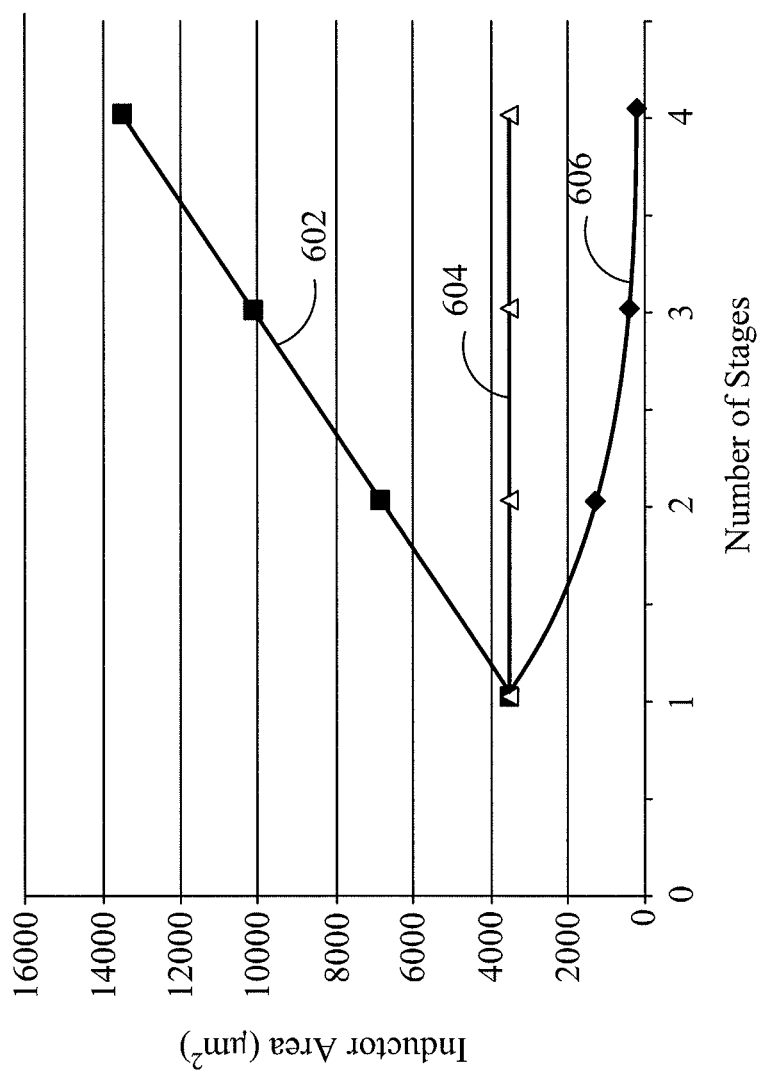
FIG. 6 is a plot of inductor area vs. number of stages of the exemplary amplifier in FIG. 2 having Ln=L/N, another exemplary amplifier sharing inductors with inductance L for inductive peaking, and yet another exemplary amplifier not sharing inductors (having separate inductors for inductive peaking) according to some embodiments.

FIG. 6 is a plot of inductor area vs. number of stages of the exemplary amplifier in FIG. 2 with Ln=L/N, another exemplary amplifier sharing inductors with inductance L for inductive peaking, and yet another exemplary amplifier not sharing inductors (having separate inductors for inductive peaking) according to some embodiments.

A line 602 shows the inductor area when an amplifier does not share inductors among multiple stages (having separate inductors for inductive peaking). It shows that the inductor area increases linearly with the number of stages. A line 604 shows the inductor area when an amplifier shares inductors that has the same inductance L of a single stage. A line 606 shows the inductor area for the exemplary amplifier in FIG. 2 with inductance Ln=L/N, which indicates substantial reduction in the inductor area compared to other cases, the difference becoming more significant as the number of stages increases.

One aspect of this description relates to a method of sharing inductors for inductive peaking of an amplifier. The method includes calculating a single stage inductance of a single stage for inductive peaking in order to have a stable impulse response. The method further includes determining a number of stages for shared inductance for inductive peaking. The method further includes sharing at least two inductors having the shared inductance among the determined number of stages for inductive peaking.

Another aspect of this description relates to a method of sharing inductors for inductive peaking of an amplifier having at least two stages. The method includes determining a bandwidth of a single stage of the at least two stages, and determining a number of stages of the at least two stages. The method further includes calculating a single stage inductance of the single stage for inductive peaking in order to have a stable impulse response, and calculating a shared inductance for inductive peaking. The method further includes sharing at least two inductors having the shared inductance among the at least two stages for inductive peaking.

Still another aspect of this description relates to an amplifier including at least two inductors, and at least two stages. Each stage of the at least two stages includes a first resistor connected to a first inductor of the at least two inductors, and a second resistor connected to a second inductor of the at least two inductors. Each stage further includes a current source selectively connected to the first resistor and the second resistor. Each stage further includes a first transistor configured to selectively connect the first resistor to the current source, and a second transistor configured to selective connect the second resistor to the current source. Each inductor of the at least two inductor has an inductance value for inductive peaking equal to an inductance value for a single stage of the at least two stages divided by a number of stages of the at least two stages. The inductance value for the single stage is calculated based on a damping factor of a transfer function of the single stage.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method of sharing inductors for inductive peaking of an amplifier, the method comprising:
    calculating a single stage inductance of a single stage for inductive peaking in order to have a stable impulse response;
    determining a number of stages for shared inductance for inductive peaking; and
    sharing at least two inductors having the shared inductance among the determined number of stages for inductive peaking.

2. The method of claim 1, further comprising regulating an output loading capacitance of at least one inductor of the at least two inductors using a capacitor connected to an output of the at least one inductor.

3. The method of claim 1, wherein sharing the at least two inductors comprises sharing the at least two inductors in a same current phase.

4. The method of claim 1, wherein sharing the at least two inductors comprises supplying an output of each inductor of the at least two inductors to a respective resistor in each stage of the determined number of stages.

5. The method of claim 4, wherein sharing the at least two inductors comprises selectively connecting the respective resistor to a current source.

6. The method of claim 5, wherein selectively connecting the respective resistor to the current source is based on a received signal from another stage of the determined number of stages.

7. The method of claim 1, wherein sharing the at least two inductors comprises sharing the at least two inductors having an inductance of each inductor of the at least two inductors less than a total inductance of the at least two inductors divided by the determined number of stages.

8. A method of sharing inductors for inductive peaking of an amplifier having at least two stages, the method comprising:
   determining a bandwidth of a single stage of the at least two stages;
   determining a number of stages of the at least two stages;
   calculating a single stage inductance of the single stage for inductive peaking in order to have a stable impulse response;
   calculating a shared inductance for inductive peaking; and
   sharing at least two inductors having the shared inductance among the at least two stages for inductive peaking.

9. The method of claim 8, further comprising regulating an output loading capacitance of at least one stage of the at least two stages using a capacitor connected to an output of the at least one stage.

10. The method of claim 8, wherein sharing the at least two inductors comprises sharing the at least two inductors in a same current phase.

11. The method of claim 8, wherein sharing the at least two inductors comprises supplying an output of each inductor of the at least two inductors to a respective resistor in each stage of the at least two stages.

12. The method of claim 11, wherein sharing the at least two inductors comprises selectively connecting the respective resistor to a current source.

13. The method of claim 12, wherein selectively connecting the respective resistor to the current source based on a received signal from another stage of the at least two stages.

14. The method of claim 8, wherein sharing the at least two inductors comprises sharing the at least two inductors having an inductance of each inductor of the at least two inductors less than a total inductance of the at least two inductors divided by a number of stages of the at least two stages.

15. An amplifier, comprising:
at least two inductors; and
at least two stages, wherein each stage of the at least two stages comprises:
   a first resistor connected to a first inductor of the at least two inductors,
   a second resistor connected to a second inductor of the at least two inductors,
   a current source selectively connected to the first resistor and the second resistor,
   a first transistor configured to selectively connect the first resistor to the current source, and
   a second transistor configured to selective connect the second resistor to the current source,
wherein each inductor of the at least two inductor has an inductance value for inductive peaking equal to an inductance value for a single stage of the at least two stages divided by a number of stages of the at least two stages, and the inductance value for the single stage is calculated based on a damping factor of a transfer function of the single stage.

16. The amplifier of claim 15, wherein the at least two stages comprises:
   a first stage configured to output a first output signal and a second output signal; and
   a second stage, wherein a first transistor of the second stage is configured to selectively connect a first resistor of the second stage to a current source of the second stage based on the first output signal, and a second transistor of the second stage is configured to selectively connect a second resistor of the second stage to the current source of the second stage based on the second output signal.

17. The amplifier of claim 15, further comprising a capacitor connected to an output of a first stage of the at least two stages.

18. The amplifier of claim 15, wherein a number of inductors of the at least two inductors is less than a total inductance of the at least two inductors divided by a number of stages of the at least two stages.

19. The amplifier of claim 15, wherein each stage of the at least two stages further comprises:
   a first output node between the first resistor and the first transistor; and
   a second output node between the second resistor and the second transistor.

20. The amplifier of claim 15, wherein the first resistor is configured to receive an output from the first inductor in a same current phase as the second resistor is configured to receive from the second inductor.

\* \* \* \* \*